United States Patent

Yasumoto et al.

[11] Patent Number: 6,040,068
[45] Date of Patent: Mar. 21, 2000

[54] CERAMIC WIRING BOARD AND METHOD OF PRODUCING THE SAME

[75] Inventors: Taka-aki Yasumoto, Kawasaki; Hideki Yamaguchi, Yokohama, both of Japan

[73] Assignee: Kabushiki Kaisha Toshiba, Japan

[21] Appl. No.: 08/909,740

[22] Filed: Aug. 12, 1997

[30] Foreign Application Priority Data

Aug. 14, 1996 [JP] Japan ................................. 8-214628

[51] Int. Cl.⁷ ........................................................ B32B 9/00
[52] U.S. Cl. ........................... 428/688; 428/627; 428/620; 428/612; 428/552; 428/570; 428/209; 428/163
[58] Field of Search .................................... 428/137, 163, 428/209, 545, 570, 552, 612, 620, 627, 688

[56] References Cited

U.S. PATENT DOCUMENTS

| | | | |
|---|---|---|---|
| 4,409,278 | 10/1983 | Jochym | 428/163 |
| 4,886,709 | 12/1989 | Sasame et al. | 428/552 |
| 5,100,714 | 3/1992 | Zsamboky | 428/137 |
| 5,153,077 | 10/1992 | Kashiba et al. | 428/627 |
| 5,326,623 | 7/1994 | Yamakawa et al. | 428/210 |
| 5,525,432 | 6/1996 | Do-Thoi et al. | 428/627 |
| 5,622,769 | 4/1997 | Kozuka et al. | 428/209 |
| 5,641,718 | 6/1997 | Horiguchi et al. | 501/96.1 |
| 5,672,848 | 9/1997 | Komorita et al. | 174/260 |
| 5,679,469 | 10/1997 | Shimoda et al. | 428/627 |
| 5,821,170 | 10/1998 | Klingbeil, Jr. et al. | 438/745 |

OTHER PUBLICATIONS

W.F. Marx et al., "Plasma and processing effects of electrode spacing for tungsten etchback using a bipolar electrostatic wafer clamp", J. Vac. Sci. Technol. A 12(6), Nov./Dec. 1994, pp. 3087–3090.

*Primary Examiner*—Wiliam Krynski
*Assistant Examiner*—Betelhem Shewareged
*Attorney, Agent, or Firm*—Finnegan, Henderson, Farabow, Garrett & Dunner, L.L.P.

[57] ABSTRACT

A ceramic wiring board has a non-oxide based ceramic substrate which is a sintered body containing aluminum nitride, silicon nitride or the like as main component, and a metallized layer formed on the non-oxide based ceramic substrate; the metallized layer is plasma-etched, irregularities having a difference of elevation of about 0.5 to about 200 nm are formed on the surface of metal particles forming the metallized layer which are positioned on the surface of the metallized surface, and a metal plated layer is further formed on the metallized layer.

10 Claims, 4 Drawing Sheets

× 20,000

× 20,000 x 20.000 x 20.000

6,040,068

CERAMIC WIRING BOARD AND METHOD OF PRODUCING THE SAME

BACKGROUND OF THE INVENTION

1. Field of the Invention

The invention relates to a ceramic wiring board having a non-oxide based ceramic substrate which has aluminum nitride or silicon nitride as main component and a method of producing the same.

2. Description of the Related Art

Demands for a ceramic substrate are increasing year by year with high integration, speeding-up, high power consuming and large integration of semiconductor devices.

Especially, since the aluminum nitride (AlN) substrate has a high thermal conductivity, outstanding thermal radiation and also a linear thermal expansion coefficient which is close to that of Si, it is expected as circuit board and semiconductor package substrate instead of an alumina ($Al_2O_3$) substrate.

A silicon nitride ($Si_3N_4$) substrate is poor in thermal conductivity as compared with the aluminum nitride substrate but has a linear thermal expansion coefficient close to that of Si and also excels in a mechanical strength and a fracture toughness value. And, its adaption for the circuit board and semiconductor package substrates is now being made. Besides, the silicon nitride substrate can be given a thermal conductivity of 40 W/mK or more which is higher than that of the alumina substrate by controlling the particle size of the silicon nitride powder and the sintering auxiliary composition, and its practical utility is being acknowledged as semiconductor substrate material.

To use the above-described aluminum nitride and silicon nitride substrates as circuit board or package substrate on which electronic parts are mounted, a metallized layer formed of W, Mo, Ni, Cr, Pd, Ag, Al, Mn or the like is formed as electrode, wiring layer or the like.

This metallized layer is formed by simultaneous sintering with the substrate or by applying and baking a conductive paste after sintering the substrate.

And, a metal plated layer formed of Ni, Au, Cu, Ag or a combination thereof is generally formed on the metallized layer in order to provide a joining property with a solder or a wire bonding property.

A liquid-phase compound, which is formed of one member or a compound of two or more members of $Y_2O_3$, $Al_2O_3$, AlN, WN, $WO_3$, $SiO_2$ or SiN while the substrate is being sintered, is present on the surface of the metallized layer, especially the surface of the metallized layer formed by the simultaneous sintering with the substrate. Such a compound is produced because a liquid-phase component which mainly has the compound added as sintering auxiliary reacts with carbon contained in a sintering atmosphere while aluminum nitride or silicon nitride is densified, and moves outside (expelled) of the aluminum nitride substrate or silicon nitride substrate. Therefore, in addition to the liquid-phase compound described above, a compound of carbon with the component elements of the liquid-phase compound is also present on the surface of the metallized layer.

The layer comprising the above-described liquid-phase compound and the compound of carbon with the liquid-phase compound interrupt the metal plated layer from being deposited on the metallized layer.

The metallized layer is generally wet-etched with an acid solution or alkaline solution prior to forming the metal plated layer on the metallized layer. To perform the wet etching, an alkaline solution of $NH_4OH$, NaOH, KOH, potassium ferricyanide, KCN or the like is generally used, but such an alkaline solution has a disadvantage that it cannot selectively etch the interrupting layer only because it acts as etchant on the aluminum nitride substrate, the silicon nitride substrate and other non-oxide based ceramic substrates.

Therefore, selection of etching conditions for thorough removal of the interrupting layer results in deterioration or changing the properties of the aluminum nitride substrate, the silicon nitride substrate or the like.

If the selected etching conditions can prevent the aluminum nitride substrate, the silicon nitride substrate or the like from being deteriorated or having its properties changed, the interrupting layer cannot be removed thoroughly, so that the metal plated layer cannot be deposited satisfactorily. In other words, the metal plated layer cannot be formed to a sufficient thickness, its thickness becomes uneven, and its adhesion strength is degraded.

Especially, recent semiconductor packages have the electrode, particularly an area of the metallized layer, made small in order to achieve atomizing or high densifying of an I/O pattern, so that an adverse effect by the interrupting layer is increased.

As described above, no technology has been achieved to remove the interrupting layer comprising the liquid-phase compound or the compound of carbon with the liquid-phase compound from the metallized layer formed on the non-oxide based ceramic substrate such as the aluminum nitride substrate or the silicon nitride substrate. And, the metal plated layer cannot be deposited satisfactorily on the metallized layer.

In view of above, it is demanded to secure a thickness of the metal plated layer, a uniform thickness, and improvement of an adhesion strength with respect to the non-oxide based ceramic substrate having the metallized layer.

And, the wet etching has a disadvantage that when the non-oxide based ceramic substrate or the metallized layer is porous, an etching solution is easy to soak therein, and the solution exudes to the surface after plating to form a reaction product, thereby easily causing discoloration. This disadvantage is also demanded to be remedied.

SUMMARY OF THE INVENTION

The invention has been achieved to deal with the above-described disadvantages and aims to provide a ceramic wiring board which is formed by having a metal plated layer having a uniform and satisfactory thickness formed on a metallized layer which is formed on a non-oxide based ceramic substrate such as an aluminum nitride substrate or a silicon nitride substrate with a sufficient adhesion strength, and also a method for producing the same.

A ceramic wiring board of the invention comprises a non-oxide based ceramic substrate, a metallized layer formed on the non-oxide based ceramic substrate, and a metal plated layer formed on the metallized layer, wherein a large number of irregularities having a difference of elevation in a range of about 0.5 to about 200 nm are formed on the surface of metal particles forming the metallized layer which are positioned on the surface of the metallized surface.

The irregularities on the surface of the metallized layer forming the ceramic wiring board of the invention have peaks and valleys having a difference of elevation in a range of about 0.5 to about 200 nm, the peaks or valleys may be formed in a large number at a horizontal interval in a range of about 0.5 to about 400 nm, or mountain-like peaks having a difference of elevation in a range of about 0.5 to about 200 nm and ravine-like valleys surrounding the mountain-like peaks.

And, a method for producing a ceramic wiring board of the invention comprises a step of producing a non-oxide based ceramic substrate having a metallized layer on its surface; a step of plasma etching at least the surface of the metallized layer in an etching gas; and a step of forming a metal plated layer on the plasma-etched metallized layer.

The invention plasma-etches the metallized layer, so that an interrupting layer comprising a liquid-phase compound and a compound of the liquid-phase compound with carbon which are present on the metallized layer surface can be removed satisfactorily without involving a change of properties or deterioration of the non-oxide based ceramic substrate.

At the same time, a large number of irregularities having a difference of elevation in a range of about 0.5 to about 200 nm can be formed on the surface of metal particles forming the metallized layer which are positioned on the surface of the metallized surface.

These irregularities become cores for deposition when the metallized layer is metal-plated, so that the metal-plated layer can be formed to a satisfactory thickness, and the metal plated layer thickness can also be made uniform. The irregularities have an anchor effect on the metal plated layer and can enhance an adhesion strength of the metal plated layer coupled with the uniform thickness of the metal plated layer.

Forms of practicing the invention will be described.

FIG. 1 is a sectional view showing the main part of one embodiment of a ceramic wiring board of the invention. In the drawing, reference numeral 1 denotes a non-oxide based ceramic substrate which is a sintered body having aluminum nitride (AlN) as main component or a sintered body having silicon nitride ($Si_3N_4$) as main component.

The sintered AlN body used as the non-oxide based ceramic substrate 1 is desired to have a thermal conductivity of 80 W/mk or more of a general substrate material. And, the sintered $Si_3N_4$ body is desired to have a thermal conductivity of 50 W/mK or more. The sintered $Si_3N_4$ body is a well-known sintered ceramic body having a high strength and high toughness. Besides, by atomizing or highly purifying silicon nitride powder as material for the sintered body or controlling the components of a sintering auxiliary, the sintered $Si_3N_4$ body having a relatively good thermal conductivity of 50 W/mK or more can be obtained without degrading the original mechanical properties such as high strength and high toughness.

A metallized layer 2 is formed on a surface 1a of the non-oxide based ceramic substrate 1, and the metallized layer 2 functions as electrode, I/O terminal, surface wiring layer, element-mounting portion or the like.

The metallized layer 2 can be formed by various methods and is not limited to be formed by a particular method.

As a method for forming the metallized layer 2, there are a simultaneous sintering method which forms the metallized layer 2 by simultaneously sintering a layer formed by coating a high-melting point metal paste which has a high-melting point metal such as W or Mo as main component with Ni, Cr, Pd, Ag, Al, Mn or the like added as required and the non-oxide based ceramic substrate 1; a thick film method which forms the metallized layer 2 by coating the non-oxide based sintered ceramic substrate 1 with a paste of metallized composition containing at least one member selected from the group consisting of Ni, Cr, Pd, Ag, Cu, Al and Mn and sintering it; and a thin film forming method which forms various kinds of metal films as the metallized layer 2 by a sputtering process or a vapor deposition method.

Among the above methods, since the metallized layer 2 formed by the simultaneous sintering method has a liquid-phase compound easily exuded out to its surface, the invention is effectively applied.

FIG. 1 shows a state that the metallized layer 2 is formed on only the surface of the non-oxide based ceramic substrate 1. But, the metallized layer (conductor layer) may be formed within the non-oxide based ceramic substrate 1 by the simultaneous sintering method. Therefore, the non-oxide based ceramic substrate 1 may be either a single substrate or a multilayered substrate.

A metal plated layer 3 which is formed of Ni, Au, Cu, Ag or a combination thereof is formed on the metallized layer 2. The surface of the metallized layer 2 on which the metal plated layer 3 is formed has been plasma-etched as described in detail afterward.

By plasma-etching the metallized layer 2, the interrupting layer comprising the liquid-phase compound formed of one member or a compound of two members or more of $Y_2O_3$, $Al_2O_3$, AlN, WN, $WO_3$, $SiO_2$, SiN or the like present on the surface of the metallized layer 2, and further the compound of carbon and elements of the liquid-phase compound can be removed satisfactorily without involving a change of properties or deterioration of the non-oxide based ceramic substrate 1 which is formed of the sintered AlN body or the sintered $Si_3N_4$ body. And, as shown in FIG. 2, a large number of minute irregularities 5 having a difference of elevation in a range of about 0.5 to about 200 nm can be formed on the surface of metal particles 4 forming the metallized layer 2 which are positioned on a surface 2a of the metallized layer 2.

Specifically, a large number of minute irregularities 5 having an elevation difference of about 0.5 to about 200 nm are formed on the surface of the metal particles 4 positioned on the surface 2a of the metallized layer 2, and these irregularities 5 are uniformly formed on the entire surface of the metal particles 4 without having directivity.

These irregularities have a state formed of independent peaks and valleys or a state formed of mountain-like peaks of ranging mountains and ravine-like valleys which surround the peaks according to the plasma etching conditions. And, in either case, the irregularities are uniformly formed on the entire surface at a difference of elevation in a range of about 0.5 to about 200 nm.

By virtue of the metallized layer 2 which was plasma-etched, the interrupting layer comprising the liquid-phase compound and the compound of the liquid-phase compound with carbon are removed, so that the metal plated layer 3 acquires a good formed state, and the metal plated layer 3 can have its thickness, uniformity of thickness and adhesion strength improved by the large number of minute irregularities 5 which are formed on the surface of the metal particles 4 of the metallized layer 2.

The irregularities 5 formed on the surface of the metal particles 4 of the metallized layer 2 become cores when metal such as Ni, Au, Cu or Ag is deposited by, for example, electroless plating, so that the metal plated layer 3 can be formed to a satisfactory thickness; since the irregularities 5 forming the cores for deposition of plating metal are uniformly present in a large number, uniformity of thickness of the metal plated layer 3 can be enhanced.

Especially, when pretreatment is performed with palladium chloride ($PdCl_2$) or the like before the electroless plating as described in detail afterward, the irregularities 5 function as a reaction accelerating portion to enable uniform deposition of Pd. And, the metal plated layer 3 to be formed then can have its thickness and uniformity improved satisfactorily. Besides, the irregularities 5 has an anchor effect on the metal plated layer 3 and can enhance an adhesion strength of the metal plated layer 3 coupled with the uniform thickness of the metal plated layer 3.

The above-described minute irregularities 5 have a difference of elevation in a range of about 0.5 to about 200 nm and are formed relatively uniformly in a large number. As shown in FIG. 3, the difference of elevation and horizontal interval of the irregularities 5 indicate an elevation difference d of the peak and the valley and a horizontal interval p of peaks (or of valleys) of the irregularities 5.

The minute irregularities 5 are desired to be formed uniformly on the entire surface of the metal particles 4 of the metallized layer 2 as described above without having directivity. These irregularities 5 which are formed on the surface of metal particles 4 can be checked by observing through an SEM (scanning electron microscope) or an AFM (interatomic force microscope) and can be discriminated from conventional irregularities formed on the metallized layer in view of regularity (repetition/interval) and size (depth).

In case of the conventional irregularities, the irregularities are formed of grooves which are present in an interface between metal particles, and gaps between metal particles. Therefore, the conventional irregularities are formed in a size level of metal particle, and can be distinctly discriminated from the irregularities 5 of the present invention.

When the irregularities 5 have an elevation difference of about 0.5 nm or below, their function as core for deposition of plated metal particles and metal particles for pretreatment thereof cannot be exerted satisfactorily, and when they have an elevation difference of more than about 200 nm, the metal plated layer 3 has its thickness made more uneven. And, when the irregularities 5 have a horizontal interval of less than about 0.5 nm, the plated metal particles and the metal particles for the pretreatment are deposited unsatisfactorily, and when they have a horizontal interval of more than about 450 nm, the metal plated layer 3 has its uniformity deteriorated.

As described above, the metal plated layer 3 formed of Ni, Au, Cu, Ag or a combination thereof is formed on the metallized layer 2 which has a large number of irregularities 5 formed on the surface of the metal particles 4 present on the surface 2a, thereby forming a ceramic wiring board 6.

The metal plated layer 3 may have either a single layered structure or a multilayered structure, and its material is not limited particularly as described above. Examples of the metal plated layer 3 include a laminated structure of an Ni-plated layer and an Au-plated layer, and these layers have functions of securing electrical and mechanical reliability and preventing the Ni layer surface from being oxidized when soldering, and the Au-plated layer has also a function of giving a wire bonding property. Thus, the metal plated layer 3 is selected as required according to its use.

The ceramic wiring board 6 of the above embodiment is used, for example, as circuit board or substrate for package. For example, where the ceramic wiring board 6 is used as package substrate, the non-oxide based ceramic substrate 1 having a multilayered structure which has an inside conductor layer is used, a laminated portion of the metallized layer 2 and the metal plated layer 3 electrically connected to the inside conductor layer functions as a connection electrode with a semiconductor device or a conductor for an external I/O terminal, specifically a solder joining part for I/O terminals. Examples of solder joining of I/O terminals include solder joining of solder bumps for BGA package, I/O pins for PGA package and the like. And, the same is also applied to flip chip bonding of a semiconductor device.

Especially, the ceramic wiring board of the invention is effective on an electrode and a terminal conductor in achieving atomizing or high densifying of an I/O pattern, namely a package substrate having an area of the metallized layer 2 made small.

Now, description will be made of a method for producing the ceramic wiring board 6 of the above embodiment.

First, the non-oxide based ceramic substrate 1 having the metallized layer 2 on at least its surface is produced. As described above, the substrate producing process may perform the simultaneous sintering of the non-oxide based ceramic substrate 1 and the metallized layer 2 as described above, or may produce the non-oxide based ceramic substrate 1 before forming the metallized layer 2.

Then, the non-oxide based ceramic substrate 1 having the metallized layer 2 on its surface is dry-etched by plasma etching. As described above, by plasma etching, the liquid-phase compound and the compound of carbon and the liquid-phase compound formed on the surface of the metallized layer 2 can be removed satisfactorily without involving a change of properties or deterioration of the non-oxide based ceramic substrate 1 which is formed of the sintered AlN body or the sintered $Si_3N_4$ body. And, a large number of minute irregularities 5 having a difference of elevation in a range of about 0.5 to about 200 nm at a substantially uniform horizontal interval can be formed on the surface of the metal particles 4 of the metallized layer 2 positioned on the surface 2a of the metallized layer 2.

Etching gas used in the plasma etching process may be $SF_6$ based, Ar based, $BrCl_3$ based, HBr based, $SiCl_4$ based, $CCl_4$ based, $CHCl_3$ based or $CFCl_3$ based, which may be used solely, but can be a mixture of $Cl_2$ gas and $O_2$ gas to enhance removability of the liquid-phase compound containing $Y_2O_3$ or the like.

Especially, the $SF_6$ based etching gas, more specifically a mixture gas of $SF_6$, $Cl_2$ and $O_2$, has a high reducing property and is good in removing the liquid-phase compound and the compound of carbon and the liquid-phase compound present on the surface of the metallized layer 2. Besides, it serves to produce the irregularities 5 having a good and uniform shape with good reproducibility. Therefore, it is a preferable etching gas.

The $SF_6+Cl_2+O_2$ mixture gas preferably consists of 40 to 98 vol % of $SF_6$, 0.2 to 50 vol % of $Cl_2$ and 0.01 to 40 vol % of $O_2$. If $SF_6$ is less than 40 vol % or $Cl_2$ is less than 0.2 vol %, the interrupting layer containing the liquid-phase compound and the compound of carbon and the liquid-phase compound may not be removed thoroughly. On the other hand, if $SF_6$ exceeds 98 vol % or $Cl_2$ exceeds 50 vol %, the metallized layer may be etched. And, if $O_2$ is less than 0.01 vol %, F is heavily adsorbed to the non-oxide based ceramic substrate 1 and the metallized layer 2, possibly resulting in changing the surface properties. And, if $O_2$ exceeds 40 vol %, the metallized layer 2 is oxidized.

A mixture gas of $SF_6$ and $O_2$ excluding $Cl_2$ from the above-described mixture gas is also effective as plasma etching gas of the invention. This mixture preferably consists of 50 to 98 vol % of $SF_6$ and 2 to 50 vol % of $O_2$.

Plasma etching by use of the above etching gas is performed using, for example, the apparatus shown in FIG. 4. In the plasma etching apparatus shown in FIG. 4, an anode electrode 12 and a cathode electrode 13 are disposed to oppose mutually in a reaction chamber 11, and for example, a ceramic wiring board 6 to be treated is placed on the cathode electrode 13. An RF power supply 14 is connected to the anode electrode 12, and plasmas are created between the anode electrode 12 and the cathode electrode 13. And, an etching gas supply system 15 and an exhaust system (not shown) are connected to the reaction chamber 11. The etching gas supply system 15 has, for example, an $SF_6$ gas cylinder 16, a $Cl_2$ gas cylinder 17 and an $O_2$ gas cylinder 18, which are controlled by gas flow rate controllers 19, respectively.

In the plasma etching apparatus shown in FIG. 4, the ceramic wiring board 6 to be treated is placed on the cathode electrode 13; the reaction camber 11 is vacuated to, for example, about $1 \times 10^{-4}$ Pa or below; gas is introduced at a predetermined flow rate from the respective gas cylinders 16, 17 and 18; and RF power is also applied from the RF power supply 14 to produce plasmas, thereby plasma-etching the ceramic wiring board 6, and especially the surface of the metallized layer 2. For the above process, the etching conditions, namely the flow rate of each gas, pressure, RF output, etching time, shall be determined as required.

After the plasma etching, the metal plated layer 3 is formed on the metallized layer 2. The metal plated layer 3 may be formed by either electroless plating or electrolytic plating. And, the invention is particularly effective in forming the metal plated layer 3 by electroless plating that a plated thickness and its uniformity depend on the surface conditions of the metallized layer 2.

For example, where Ni plating is performed by electroless plating, the surface of the metallized layer 2 is pretreated with a $PdCl_2$ solution. At this time, the surface of the metallized layer 2 has the liquid-phase compound and the compound of carbon and the liquid-phase compound removed by plasma etching and a large number of minute irregularities 5 having a difference of elevation in a range of about 0.5 to about 200 nm formed at uniform horizontal intervals, so that Pd can be deposited uniformly. By forming the metal plated layer 3 on the metallized layer 2 in the pretreated state, metal such as Ni, Au, Cu or Ag can be deposited satisfactorily, and the metal plated layer 3 can have its thickness uniformity and adhesion strength improved.

Besides, discoloration or the like can be prevented from taking place because soaking of a liquid does not occur unlike conventional wet etching.

DESCRIPTION OF THE PREFERRED EMBODIMENTS

Now, specific embodiments of the invention and evaluated results thereof will be described.

Embodiment 1

First, an AlN substrate having a W metallized layer was produced by simultaneous sintering and undergone plasma etching under the following conditions.

Figure 1:
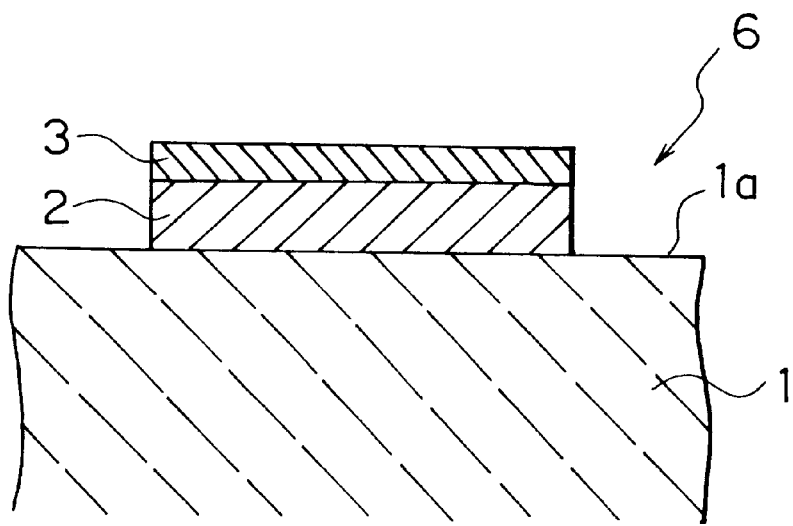
FIG. 1 is a sectional view showing the main part of a ceramic wiring board of the invention.
Figure 2:
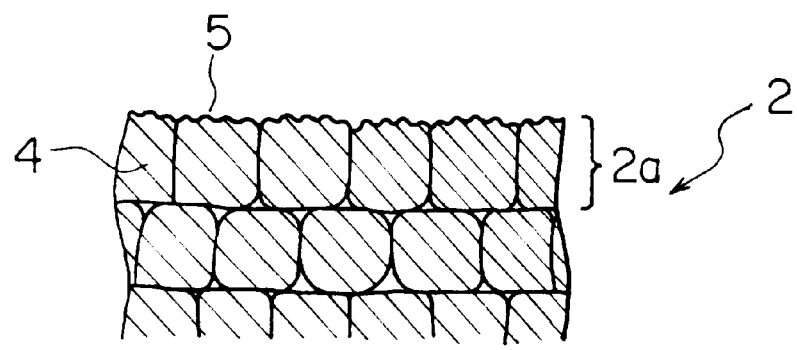
FIG. 2 is an enlarged sectional schematic view showing a part of metallized layer of the ceramic wiring board shown in FIG. 1.
Figure 3:
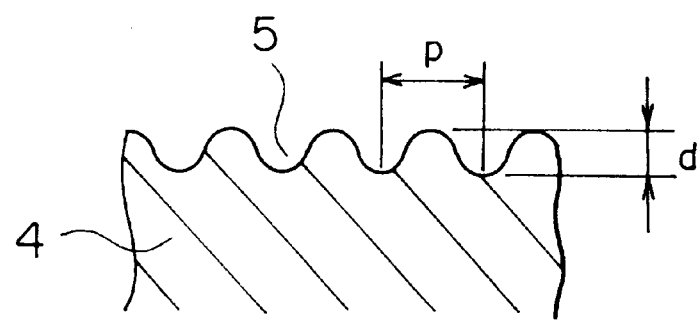
FIG. 3 is an enlarged sectional schematic view showing the surface of the metallized layer shown in FIG. 2.
Figure 4:
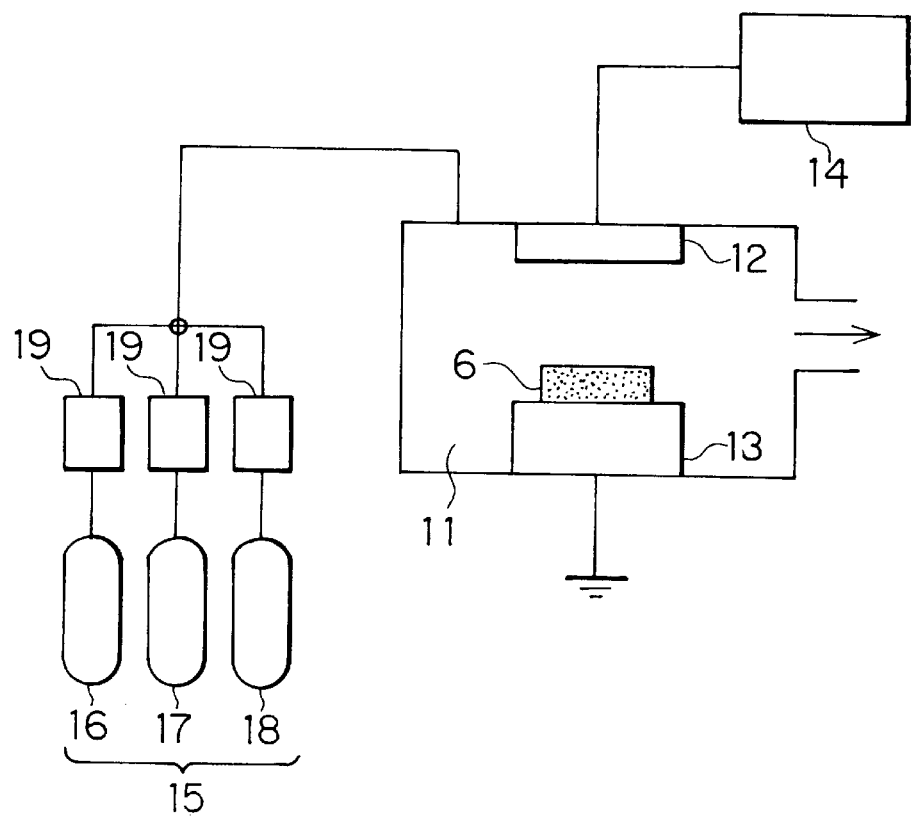
FIG. 4 is a diagram showing one embodiment of a plasma etching apparatus to be used in a production process for the ceramic wiring board of the invention.

The plasma etching was performed by the plasma etching apparatus shown in FIG. 4. An anode electrode 12 and a cathode electrode 13 had a size of 400×400 mm and a gap distance of 50 mm between them. Etching gas was a mixture of $SF_6$, $Cl_2$ and $O_2$ which respectively had a flow rate of 180 SCCM, 10 SCCM and 10 SCCM. Plasmas were produced under a pressure of 1 Pa in a reaction chamber 11 and an RF output of 600W. Under these conditions, plasma etching was performed for one minute.

It was verified that the W metallized layer surface had component elements W, Al, N, Y and O before the plasma etching but had component elements W, Al and N after the etching, and a layer having changed properties such as a liquid phase compound was removed.

Figure 6:
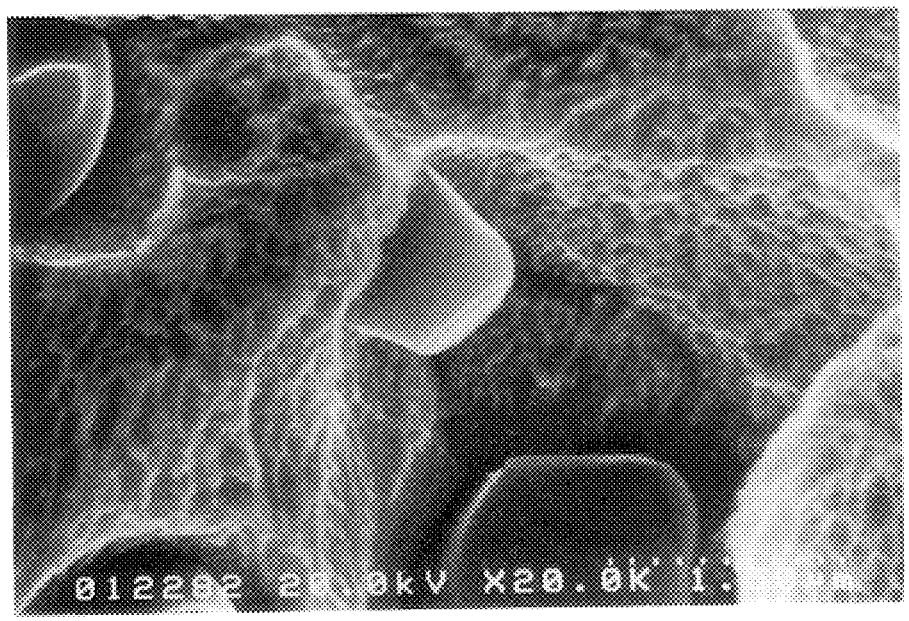
FIG. 6 is a photograph of the surface of the metallized layer in Embodiment 1 of the invention taken through a scanning electron microscope.

The surface of W particles positioned on the W metallized layer surface after the plasma etching was observed for its state through a scanning electron microscope (SEM) and an inter atomic force microscope (AFM). As shown in FIG. 6, irregularities consisting of peaks and valleys having a difference of elevation in a range of about 20 to about 80 nm were formed at a horizontal interval of about 30 to about 100 nm.

Figure 5:
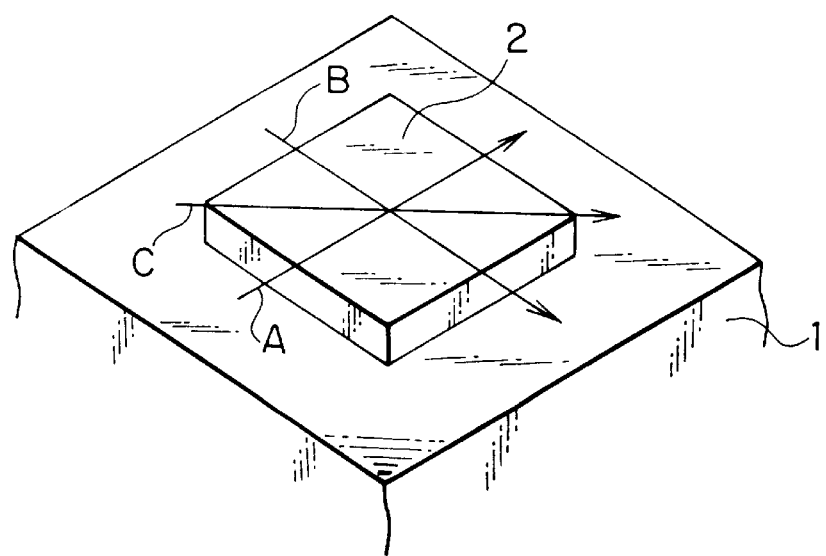
FIG. 5 is a diagram showing directions of observing the surface of the metallized layer in Embodiment 1 of the invention.

FIG. 5 shows the state of irregularities of a W metallized layer 2 which was observed in three directions (A, B, C). It was found that the irregularities were formed on the entire surface without having directivity.

The AlN substrate undergone the plasma etching was checked for a state of its surface but found no change of properties or deterioration. Besides, the W metallized layer itself was hardly etched.

An Ni plated layer was formed toward a target thickness of 2 $\mu$m on the W metallized layer by electroless plating. Prior to the electroless plating, the W metallized layer was pretreated with a $PdCl_2$ solution. The obtained Ni-plated layer was measured for its thickness at ten points of the layer surface, and a thickness distribution was determined from a mean value and a ratio of the maximum and minimum values. The mean value of thickness was 2.1 $\mu$m and the thickness distribution was ±100 nm.

Thus, by plasma etching of the W metallized layer, the Ni plated layer having a uniform and satisfactory thickness can be formed on the W metallized layer without involving deterioration of the AlN substrate or the W metallized layer.

Embodiments 2 to 10

Non-oxide based ceramic substrates having the metallized layers shown in Table 1 were plasma-etched under the conditions (the conditions not shown in Table 1 are the same as those of Embodiment 1) shown in Table 1, and the metal-plated layers shown in Table 1 were formed. The metal-plated layers were deposited toward a target thickness of 2 μm by electroless plating. The metallized layer surface of the respective ceramic wiring boards was measured and evaluated on component elements, difference of elevation and horizontal intervals of peaks and valleys, and thickness and thickness distribution of the metal-plated layers in the same way as in Embodiment 1. The results obtained are also shown in Table 1.

Figure 7:
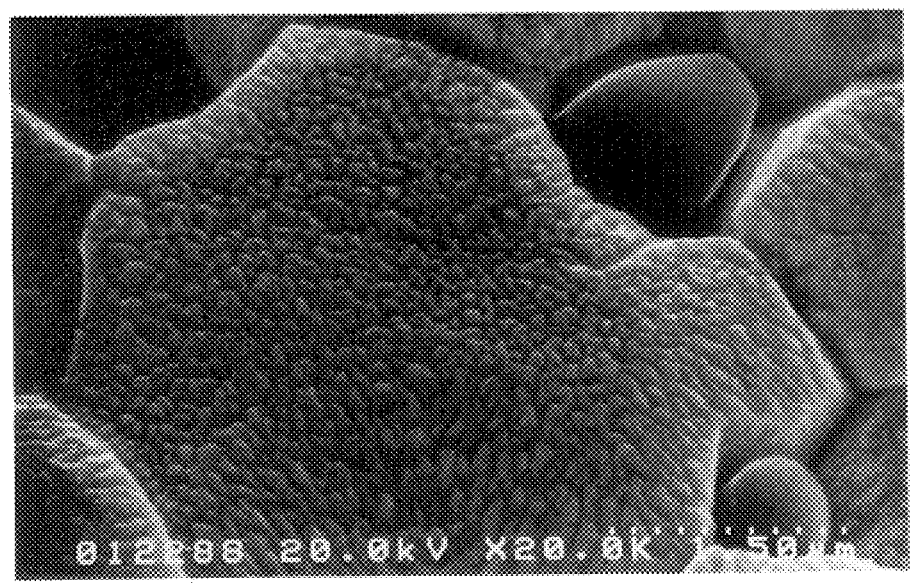
FIG. 7 is a photograph of the surface of the metallized layer in Embodiment 2 of the invention taken through a scanning electron microscope.

FIG. 7 shows an SEM photo of the metallized layer surface of Embodiment 2.

Comparative Embodiments 1 to 6

The respective non-oxide based ceramic substrates having the metallized layers shown in Table 1 were undergone wet etching (a temperature of 313K for three minutes) with etchants (molar ratios of respective chemicals indicated) shown in Table 1. And, the metal plated layers were formed as shown in Table 1. The metal plated layers were deposited toward a target thickness of 2 μm by electroless plating. The respective ceramic wiring boards were measured and evaluated on component elements of the metallized layer surface, difference of elevation and horizontal intervals of peaks and valleys, and thickness and thickness distribution of the metal-plated layers in the same way as in Embodiment 1. The results obtained are also shown in Table 1.

On the other hand, in the respective comparative embodiments in that the metallized layer was wet-etched, liquid phase compound residues were on the metallized layer surface, and the surface had substantially no change in its shape. As a result, no plated layer thickness was satisfactory, and the thickness distribution was about 100% large to the plate thickness.

Embodiments 11 to 15

AlN substrates having a W metallized layer was produced by simultaneous sintering, and the AlN substrate were plasma-etched under the following conditions.

The plasma etching was performed by using the plasma etching apparatus shown in FIG. 4 with the same gap distance between the anode electrode 12 and the cathode electrode 13 as the embodiment 1.

Etching gas was a mixture of $SF_6$ and $O_2$ without containing $Cl_2$. Plasma was produced under conditions of the flow rate of each gas and the pressure in the reaction chamber 11 as shown in Table 1 and an RF output of 600 W. Plasma etching was performed for one minute under these conditions.

Besides, the metal plated layers shown in Table 1 were formed. Respective metal plated layers were deposited toward a target thickness of 2 μm by electroless plating.

The metallized layer surface of the respective ceramic wiring boards was measured and evaluated on component elements, differences of elevation and horizontal intervals of

TABLE 1

| | | | Etching conditions | | Elements on metallized layer surface | | Plated layer | |
| | | | Gas flow rate | | | | | |
| | Substrate | Metal-lizing | (sccm) SF:Cl:O | Pressure (pascal) | Pre-etching | Post-etching | Kind | Thickness (μm) |
|---|---|---|---|---|---|---|---|---|
| | | | | Embodiments | | | | |
| 1 | AlN | W | 180:10:10 | 10 | W,Al,N,Y,O | W,Al,N | Ni | 2.1 |
| 2 | AlN | W | 150:15:15 | 8 | W,Al,N,Y,O | W,Al,N | Ni | 2.2 |
| 3 | AlN | W | 360:20:20 | 20 | W,Al,N,Y,O | W,Al,N | Ni | 2.0 |
| 4 | AlN | W | 270:15:15 | 15 | W,Al,N,Y,O | W,Al,N | Ni | 2.1 |
| 5 | AlN | W | 90:5:5 | 5 | W,Al,N,Y,O | W,Al,N | Ni | 2.1 |
| 6 | AlN | W—Mn | 180:10:10 | 10 | W,Al,N,Y,O,Mn | W,Al,N,Mn | Ni | 2.0 |
| 7 | AlN | Mo | 270:15:15 | 15 | Mo,Al,N,Y,O | Mo,Al,N | Cu | 2.0 |
| 8 | AlN | Al | 320:40:40 | 20 | Al,N,Y,O | Al,N | NiCo | 2.0 |
| 9 | SiN | W | 320:40:40 | 20 | W,Si,Al,N,Y,O | Si,W,N | Ni | 2.2 |
| 10 | SiN | Mo | 270:15:15 | 15 | Mo,Si,N,Y,O | Mo,Si,N | Ni | 2.0 |
| 11 | AlN | W | 270:29:0.5 | 15 | W,Al,N,Y,O | W,Al,N | Ni | 2.0 |
| 12 | AlN | W | 120:0:120 | 5 | W,Al,N,Y,O | W,Al,N | Ni | 2.1 |
| 13 | AlN | W | 120:0:60 | 20 | W,Al,N,Y,O | W,Al,N | Ni | 2.2 |
| 14 | AlN | W | 60:0:10 | 10 | W,Al,N,Y,O | W,Al,N | Ni | 2.2 |
| 15 | AlN | W | 60:0:5 | 5 | W,Al,N,Y,O | W,Al,N | Ni | 2.2 |
| | | | | Comparative Embodiments | | | | |
| 1 | AlN | W | 2.0/KOH | | W,Al,N,Y,O | W,Al,N,Y,O | Ni | 0.7 |
| 2 | AlN | W | 2.0/NH4OH | | W,Al,N,Y,O | Al,Y,O | Ni | <0.1 |
| 3 | AlN | W | 3.0/KCN | | W,Al,N,Y,O | Al,Y,O | Ni | <0.1 |
| 4 | AlN | W | 10/NaOH | | W,AL,N,Y,O | Al,Y,O | Ni | <0.1 |
| 5 | AlN | W | 2.0/KOH | | W,Si,Al,N,Y,O | Al,Y,O | Ni | <0.1 |

It is apparent from Table 1 that no liquid phase compound or the like is on the metallized layers according to the respective embodiments. And, it is seen from the SEM photo of the metallized layer surface shown in FIG. 7 that irregularities having a difference of elevation of about a few dozen to 100 nm were formed at a horizontal interval of about a few dozen to 100 nm.

The metal plated layers formed on these metallized layer surfaces were uniform with a thickness distribution of about 200 nm, which corresponds to 10% of the plate thickness.

peaks and valleys, and thickness of the metal-plated layers in the same way as in Embodiment 1. The results obtained are also shown in Table 1.

Figure 8:
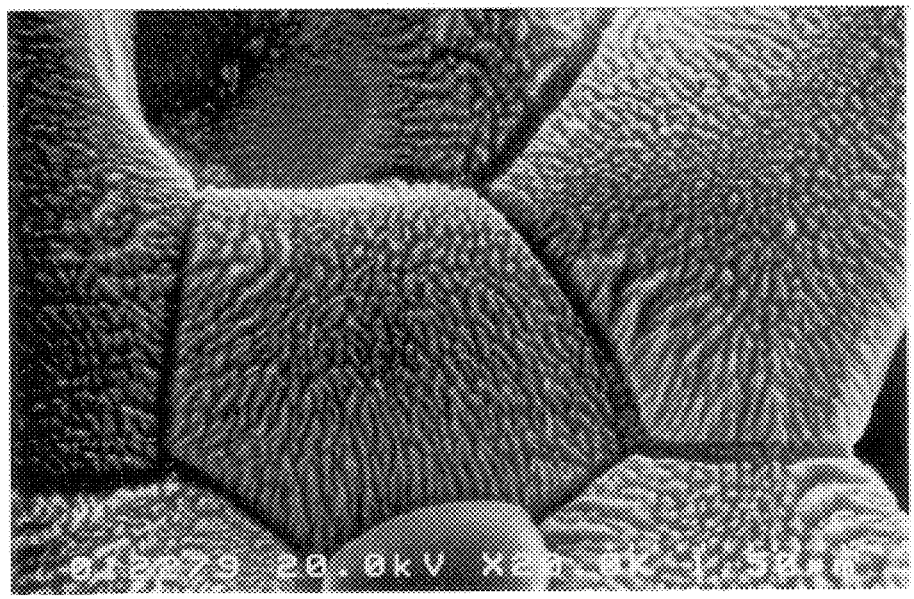
FIG. 8 is a photograph of the surface of the metallized layer in Embodiment 11 of the invention taken through a scanning electron microscope.
Figure 9:
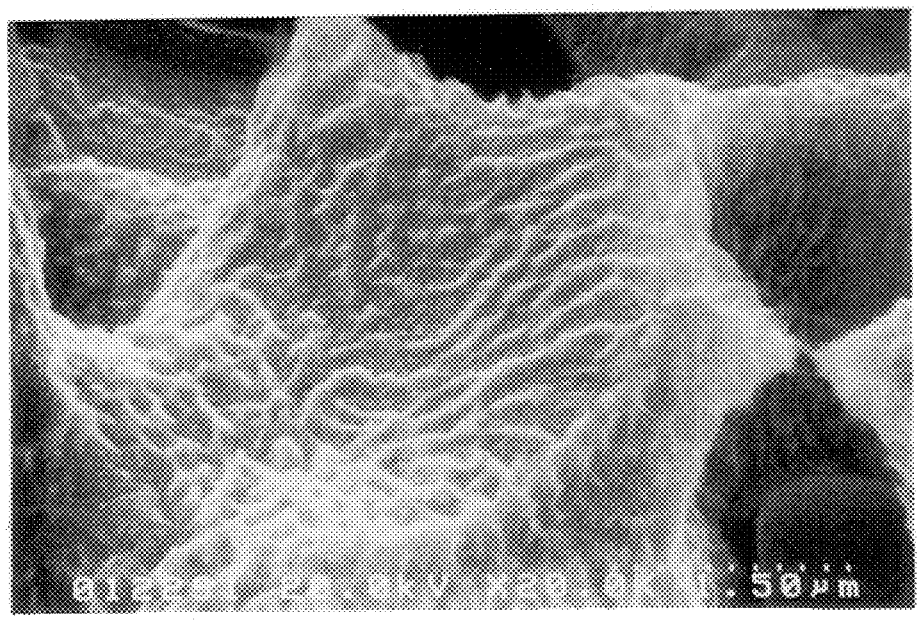
FIG. 9 is a photograph of the surface of the metallized layer in Embodiment 12 of the invention taken through a scanning electron microscope.

FIG. 8 and FIG. 9 show SEM photos showing the states of the metallized layer surfaces of Embodiments 11 and 12.

While the irregularities on the metallized layer surfaces of Embodiments 1 to 10 had the shape of a crater, the irregularities on the metallized layer surfaces of Embodiments 11 to 15 were formed of a large number of small mountain-like peaks and ravine-like valleys as shown in FIG. 8 and FIG.

9. These irregularities has a difference of elevation in a range of about 20 nm to about 50 nm.

Prior to etching, the component elements of the metallized layer surface of the AlN substrate were W, Al, N, Y and O; and after etching, the component elements of the W metallized layer surface were W, Al and N. It was ascertained that the layer of changed properties such as a liquid-phase compound was removed.

And, the Ni plated layer formed on these metallized layer surfaces was a metal plated layer having a thickness of 2.0 μm or more and a thickness distribution of about 200 nm on the surface.

Where a gas mixture of $SF_6$ and $O_2$ was used as plasma etching gas as in Embodiments 11 to 15, the metal plated layer having a uniform and satisfactory thickness was formed on the metallized layer with a sufficient adhesion strength in the same way as in Embodiments 1 to 10.

As described above, the present invention can form a metal plated layer having a uniform and sufficient thickness on the metallized layer which is formed on the non-oxide based ceramic substrate with a sufficient adhesion strength. Therefore, practicality and reliability of the ceramic wiring board can be improved remarkably.

What is claimed is:

1. A ceramic wiring board comprising a non-oxide based ceramic substrate, a metallized layer formed on the non-oxide based ceramic substrate, and a metal plated layer formed on the metallized layer, wherein the metallized layer has a large number of minute irregularities having a difference of elevation in a range of about 0.5 to about 200 nm formed on a surface of metal particles forming the metallized layer, the minute irregularities consisting of peaks and valleys, the peaks being formed at intervals of about 0.5 to about 450 nm.

2. The ceramic wiring board as set forth in claim 1, wherein the irregularities are uniformly formed on the entire surface of component metal particles of the metallized layer without having directivity.

3. The ceramic wiring board as set forth in claim 1, wherein the metallized layer is a sintered layer simultaneously formed with the non-oxide based ceramic substrate.

4. The ceramic wiring board as set forth in claim 1, wherein the metallized layer has at least one selected from the group consisting of W and Mo as a main component.

5. The ceramic wiring board as set forth in claim 4, wherein the non-oxide based ceramic substrate is a sintered ceramic body having aluminum nitride as a main component.

6. The ceramic wiring board as set forth in claim 5, wherein a surface layer of the metallized layer essentially consists of Al, N and an element selected from the group consisting of W and Mo.

7. The ceramic wiring board as set forth in claim 4, wherein the non-oxide based ceramic substrate is a sintered ceramic body having silicon nitride as a main component.

8. The ceramic wiring board as set forth in claim 7, wherein a surface layer of the metallized layer essentially consists of Si, N and an element selected from the group consisting of W and Mo.

9. The ceramic wiring board as set forth in claim 1, wherein a surface of the metallized layer is plasma-etched.

10. The ceramic wiring board as set forth in claim 1, wherein a surface layer of the metallized layer is substantially free of liquid-phase compounds.

* * * * *